United States Patent
Yao et al.

(10) Patent No.: US 9,111,905 B2
(45) Date of Patent: Aug. 18, 2015

(54) HIGH ELECTRON MOBILITY TRANSISTOR AND METHOD OF FORMING THE SAME

(75) Inventors: Fu-Wei Yao, Hsinchu (TW); Chen-Ju Yu, Jiaoxi Township (TW); King-Yuen Wong, Tuen Mun, N. T. (TW); Chun-Wei Hsu, Taichung (TW); Jiun-Lei Jerry Yu, Zhudong Township (TW); Fu-Chih Yang, Fengshan (TW); Chun Lin Tsai, Hsinchu (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 380 days.

(21) Appl. No.: 13/434,431

(22) Filed: Mar. 29, 2012

(65) Prior Publication Data

US 2013/0256679 A1   Oct. 3, 2013

(51) Int. Cl.
*H01L 29/66* (2006.01)
*H01L 29/417* (2006.01)
*H01L 29/778* (2006.01)
*H01L 29/08* (2006.01)

(52) U.S. Cl.
CPC ...... *H01L 29/41725* (2013.01); *H01L 29/0843* (2013.01); *H01L 29/66462* (2013.01); *H01L 29/7787* (2013.01)

(58) Field of Classification Search
CPC ............ H01L 29/66431; H01L 29/778; H01L 21/823814; H01L 21/823418; H01L 29/66507
USPC ............... 257/76, 194, 20, 14, 195, 377, 382, 257/384; 438/478
See application file for complete search history.

(56) References Cited

U.S. PATENT DOCUMENTS

| | | | |
|---|---|---|---|
| 7,736,962 B1* | 6/2010 | Mori | 438/186 |
| 8,563,372 B2* | 10/2013 | Hagleitner et al. | 438/172 |
| 2006/0189109 A1* | 8/2006 | Fitzgerald | 438/586 |
| 2008/0157208 A1* | 7/2008 | Fischer et al. | 257/368 |
| 2008/0296622 A1* | 12/2008 | Kiewra et al. | 257/194 |

OTHER PUBLICATIONS

Imada et al., "Enhancement-Mode GaN MIS-HEMTs for Power Supplies",2010,IEEE, pp. 1027-1033.*
Imada et al., "Enhancement-Mode GaN MIS-HEMTs for Power Supplies",2010,International Power Electronics Conference,pp. 1027-1033.*
Chen, Hongwei, et al., "Enhancement-Mode AlGaN/GaN HEMTs Fabricated by Standard Fluorine Ion Implantation", CS Mantech Conference, May 17-20, 2010, pp. 145-148.

(Continued)

*Primary Examiner* — Tan N Tran
(74) *Attorney, Agent, or Firm* — Lowe Hauptman & Ham, LLP

(57) ABSTRACT

A high electron mobility transistor (HEMT) includes a first III-V compound layer. A second III-V compound layer is disposed on the first III-V compound layer and is different from the first III-V compound layer in composition. A carrier channel is located between the first III-V compound layer and the second III-V compound layer. A salicide source feature and a salicide drain feature are in contact with the first III-V compound layer through the second III-V compound layer. A gate electrode is disposed over a portion of the second III-V compound layer between the salicide source feature and the salicide drain feature.

20 Claims, 9 Drawing Sheets

(56) References Cited

OTHER PUBLICATIONS

Imada, T., et al., "Enhancement-Mode GaN MIS-HEMTs for Power Supplies", The 2010 International Power Electronics Conference, pp. 1027-1033.

Cai, Yong, et al., "High-Performance Enhancement-Mode AlGaN/GaN HEMTs Using Fluoride-Based Plasma Treatment", IEEE Electron Device Letters, vol. 26, No. 7, Jul. 2005, pp. 435-437.

* cited by examiner

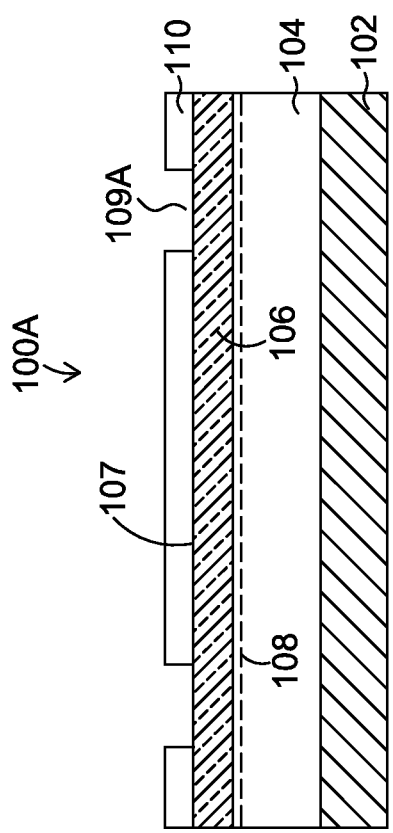
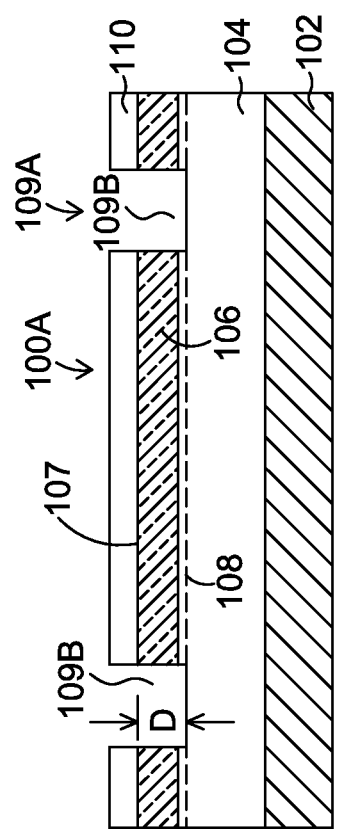

HIGH ELECTRON MOBILITY TRANSISTOR AND METHOD OF FORMING THE SAME

TECHNICAL FIELD

This disclosure relates generally to a semiconductor structure and, more particularly, to a high electron mobility transistor (HEMT) and method for forming a high electron mobility transistor.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

From an application point of view, HEMTs have many advantages. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 4 to 13B are cross-sectional views of two example semiconductor structures each having a HEMT at various stages of manufacture according to one or more embodiments of the method of FIG. 3.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is divided on the substrate by scribe lines between the chip regions. The substrate will go through a variety of cleaning, layering, patterning, etching and doping steps to form integrated circuits. The term "substrate" herein generally refers to the bulk substrate on which various layers and device structures are formed. In some embodiments, the substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1A:
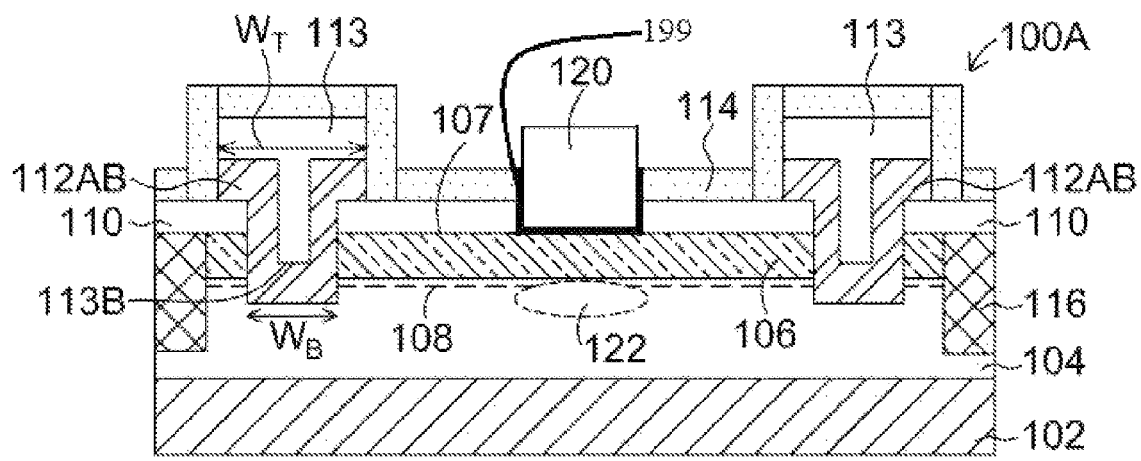
FIG. 1A is a cross-sectional view of a semiconductor structure having a high electron mobility transistor (HEMT) according to one embodiment of this disclosure.

FIG. 1A is a cross-sectional view of a semiconductor structure 100A having a high electron mobility transistor (HEMT) according to one or more embodiments of this disclosure.

Referring to FIG. 1A, the semiconductor structure 100A having a HEMT is illustrated. The semiconductor structure 100A includes a substrate 102. In the present example, the substrate 102 includes a silicon substrate. In some embodiments, the substrate 102 includes a silicon carbide (SiC) substrate or sapphire substrate.

The semiconductor structure 100A also includes a heterojunction formed between two different semiconductor material layers, such as material layers with different band gaps. For example, the semiconductor structure 100A includes a non-doped narrow-band gap channel layer and a wide-band gap n-type donor-supply layer. In at least one embodiment, the semiconductor structure 100 includes a first III-V compound layer (or referred to as a channel layer) 104 formed on the substrate 102 and a second III-V compound layer (or referred to as a donor-supply layer) 106 formed on the channel layer 104. The channel layer 104 and the donor-supply layer 106 are compounds made from the III-V groups in the periodic table of elements. However, the channel layer 104 and the donor-supply layer 106 are different from each other in composition. The channel layer 104 is undoped or unintentionally doped (UID). In the present example of the semiconductor structure 100A, the channel layer 104 includes a gallium nitride (GaN) layer (also referred to as the GaN layer 104). In the present example, the donor-supply layer 106 includes an aluminum gallium nitride (AlGaN) layer (also referred to as AlGaN layer 106). The GaN layer 104 and AlGaN layer 106 directly contact each other. In some embodiments, the channel layer 104 includes a GaAs layer or InP layer. In some embodiments, the donor-supply layer 106 includes an AlGaAs layer, AN or AlInP layer.

A band gap discontinuity exists between the AlGaN layer 106 and the GaN layer 104. The electrons from a piezoelectric effect in the AlGaN layer 106 drop into the GaN layer 104, creating a thin layer 108 of highly mobile conducting electrons in the GaN layer 104. This thin layer 108 is also referred to as a two-dimensional electron gas (2-DEG), and forms a carrier channel (also referred to as the carrier channel 108). The thin layer 108 of 2-DEG is located at an interface of the AlGaN layer 106 and the GaN layer 104. Thus, the carrier channel has high electron mobility because the GaN layer 104 is undoped or unintentionally doped, and the electrons can move freely without collision or with substantially reduced collisions with impurities.

In some embodiments, the GaN layer 104 is undoped. In some embodiments, the GaN layer 104 is unintentionally doped, such as lightly doped with n-type dopants due to a precursor used to form the GaN layer 104. In at least one example, the GaN layer 104 has a thickness in a range from about 0.5 microns to about 10 microns.

In some embodiments, the AlGaN layer 106 is intentionally doped. In at least one example, the AlGaN layer 106 has a thickness in a range from about 5 nanometers (nm) to about 50 nm.

The semiconductor structure 100A also includes a dielectric cap layer 110 disposed on a top surface 107 of the AlGaN layer 106. The dielectric cap layer 110 further includes a plurality of openings that expose a portion of the AlGaN layer 106 for a gate electrode formation and source/drain features formation. The dielectric cap layer 110 protects the underlying AlGaN layer 106 from damage in the following processes having plasma environments.

The semiconductor structure 100A also includes salicide source/drain features 112AB disposed on the AlGaN layer 106 and configured to electrically connect to the carrier channel 108. The AlGaN layer 106 has a substantially flat top surface between the salicide source feature and the salicide drain feature. Each of the salicide source/drain features 112AB comprises silicon and a metal including at least one of Ti, Co, Ni, W, Pt, Ta, Pd and Mo. The salicide source/drain feature 112AB is formed by constructing a silicon feature and a metal layer in a through hole of the AlGaN layer 106. Then, a thermal annealing process is applied to the silicon feature and the metal layer such that the silicon feature, the metal layer, the AlGaN layer 106 and the GaN layer 104 react to form an intermetallic compound. The salicide source/drain feature 112AB contacts the carrier channel 108 located at the interface of the AlGaN layer 106 and the GaN layer 104. Due to the formation of the through hole in AlGaN layer 106, the silicon elements in the intermetallic compound diffuse deeper into the AlGaN layer 106 and the GaN layer 104. The intermetallic compound improves electrical connection and forms ohmic contacts between the salicide source/drain feature 112AB and the carrier channel 108.

In one embodiment, the salicide source/drain features 112AB are formed in the openings of the dielectric cap layer 110. The salicide source/drain feature 112AB is at least partially embedded in the AlGaN layer 106 and a top portion of the GaN layer 104 and overlies a portion of the dielectric cap layer 110. Thereby, the salicide source/drain feature 112AB has a concave top surface. The salicide source/drain feature 112AB has a top width $W_T$ and a bottom width $W_B$. The top width $W_T$ is wider than the bottom width $W_B$.

In another embodiment, the salicide source/drain feature 112AB is partially embedded in the AlGaN layer 106 and does not overlie a portion of the dielectric cap layer 110. The top width $W_T$ and the bottom width $W_B$ are substantially the same.

The semiconductor structure 100A further includes an ohmic metal unit 113 disposed on each salicide source/drain feature 112AB. The ohmic metal unit 113 is free of Au and comprises Al, Ti, Cu, Mo, Ti or Ni. The ohmic metal unit 113 is at least partially embedded in the salicide source/drain feature 112AB. A bottom surface 113B of the ohmic metal unit 113 is lower than the top surface of the AlGaN layer 106. The ohmic metal unit 113 is close to the carrier channel 108 and improves electrical connection.

The semiconductor structure 100A further includes isolation regions 116 in the GaN layer 104 and the AlGaN layer 106. The isolation regions 116 isolate the HEMT in the structure 100A from other devices in the substrate 102. In at least one example, the isolation region 116 includes a doped region with species of oxygen or nitrogen.

Still referring to FIG. 1A, a protection layer 114 is disposed on top surfaces of the dielectric cap layer 110 and the salicide source/drain features 112AB. The protection layer 114 further includes an opening that aligns with an opening in the dielectric cap layer 110. The combined opening of the opening in the protection layer 114 and the opening in the dielectric cap layer 110 exposes a portion of the AlGaN layer 106 for gate electrode formation. The protection layer 114 covers the salicide source/drain features 112AB, and protects the source/drain features from exposure during an annealing process in the formation of the isolation regions 116.

The semiconductor structure 100A also includes a gate electrode 120 disposed in the combined opening over AlGaN layer 106 between the salicide source/drain features 112AB. The gate electrode 120 includes a conductive material layer configured for applying a gate voltage that in turns controls the carrier channel 108. In various examples, the conductive material layer includes a refractory metal or its compounds, e.g., titanium (Ti), titanium nitride (TiN), titanium tungsten (TiW), titanium tungsten nitride (TiWN), tungsten (W) or tungsten nitride (WN). In at least another example, the conductive material layer includes nickel (Ni), gold (Au) or copper (Cu).

The semiconductor structure 100A also includes a depletion region 122 in the carrier channel 108 under the combined opening of the protection layer 114 and the dielectric cap layer 110. The carrier channel 108 becomes normally-off because of the depletion region 122. In the operation, a positive gate voltage is applied to turn on the carrier channel 108 of this HEMT. In the embodiment of FIG. 1A, the HEMT is also called an enhanced-mode HEMT (also referred to as enhanced-mode HEMT 100A).

In one embodiment, the enhanced-mode HEMT 100A further includes a carrier depletion layer 199. The carrier depletion layer 199 is disposed along an interior surface of the combined opening of the protection layer 114 and the dielectric cap layer 110, on the exposed portion of the AlGaN layer 106 and underlying a portion of the gate electrode 120. In some examples, the carrier depletion layer 199 comprises $NiO_x$, $ZnO_x$, $FeO_x$, $SnO_x$, $CuAlO_2$, $CuGaO_2$ or $SrCu_2O_2$. X is in a range of about 1 to about 2. The carrier depletion layer 199 contains point defects, for example, $ZnO_x$ has Zn interstitials and oxygen vacancies. The point defects generate electron holes and induce p-type conductivity for the carrier depletion layer. The carrier depletion layer 199 depletes the electrons in the carrier channel 108 under the combined opening.

In another embodiment, the enhanced-mode HEMT 100A further includes a fluorine-containing region (not shown) in a portion of the AlGaN layer 106 and underlying a portion of the gate electrode 120. It is believed that fluorine ions in the fluorine-containing region provide strong immobile negative charges and effectively deplete the electrons in the carrier channel 108.

Figure 1B:
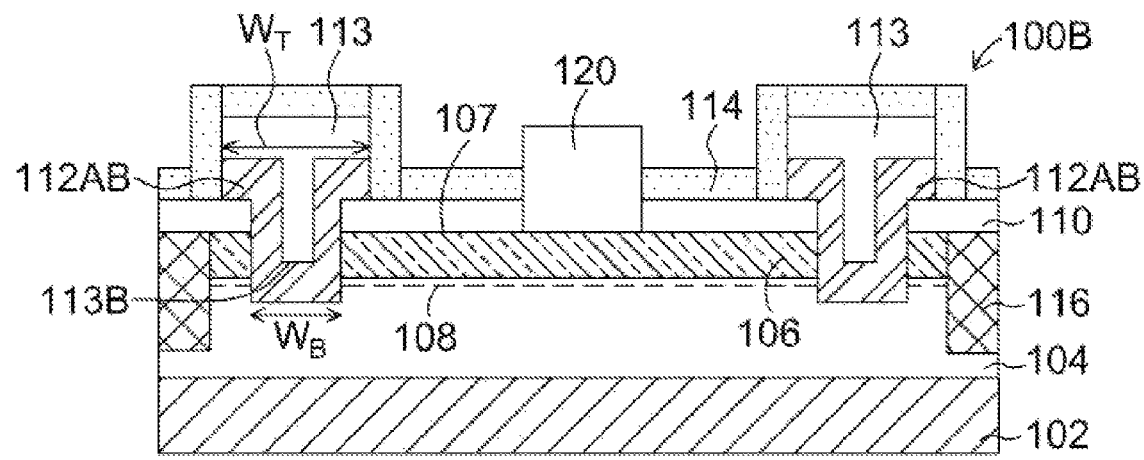
FIG. 1B is a cross-sectional view of a semiconductor structure having an HEMT according to another embodiment of this disclosure.

FIG. 1B is a cross-sectional view of the semiconductor structure 100B having a HEMT according to another embodiment of this disclosure. The layer stacks of the semiconductor structure 100B are similar to the semiconductor structure 100A shown in FIG. 1A. However, the HEMT in the semiconductor structure 100B is a depletion-mode HEMT (also referred to as depletion-mode HEMT 100B). The depletion-mode HEMT 100B has a normally-on carrier channel and a negative gate voltage is applied to turn off the carrier channel. The depletion-mode HEMT 100B does not include the depletion region 122, the carrier depletion layer or the fluorine-containing region of the enhanced-mode HEMT 100A.

In the above described embodiments, the gate electrode 120, the salicide source/drain features 112AB, and the carrier channel 108 in the GaN layer 104 are configured as a transistor. When a voltage is applied to the gate stack, a device current of the transistor is modulated.

Figure 2B:
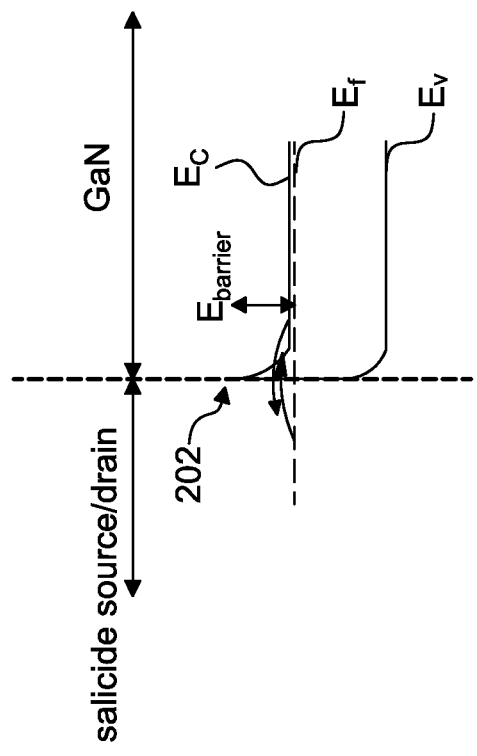
FIG. 2B is a potential diagram of an interface of a source/drain and a GaN layer of the HEMT shown in FIGS. 1A and 1B.
Figure 2A:
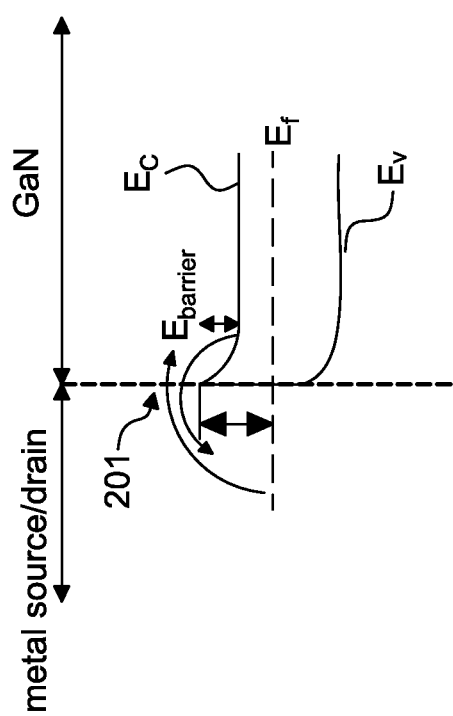
FIG. 2A is a potential diagram of an interface of a source/drain and a GaN layer of a comparative HEMT.

FIG. 2A is a potential diagram of an interface 201 of a source/drain and a GaN layer of a comparative HEMT. The source/drain includes a metal layer. $E_c$ is the conduction band. $E_f$ is the Fermi level. $E_v$ is the valence band. There is a potential barrier $V_{bn}$, for an electron in metal source/drain trying to move into conductance band $E_c$ of GaN layer at the interface 201. Also, there is a built-in potential barrier $V_{bi}$ for an electron in conductance band $E_c$ of GaN layer trying to move into metal source/drain at the interface 201. An electron in either side needs to gain enough energy to surmount the potenital barrier $V_{bi}$, or $V_{bi}$ to enter the other side. The electrical connection between the metal source/drain and the GaN layer of a comparative HEMT is limited.

FIG. 2B shows a potential diagram of an interface 202 of a salicide source/drain feature and a GaN layer of the HEMT of the semiconductor structure 100A (or 100B) shown in FIG. 1A (or 1B). With the presence of the silicon elements in the salicide source/drain feature, conductance band $E_c$ of GaN layer at the interface 202 is distorted. A width of a depletion region near the interface 202 decreases as the silicon elements diffusing into the GaN layer. A certain amount of electrons in the GaN layer and the salicide source/drain feature will tunnel through the potential barrier at the interface 202 and move into the other side. The silicon elements of salicide source/drain feature improve electrical connection and form ohmic contacts between the salicide source/drain feature 112AB and the GaN layer 104 in FIGS. 1A and 1B.

Figure 3:
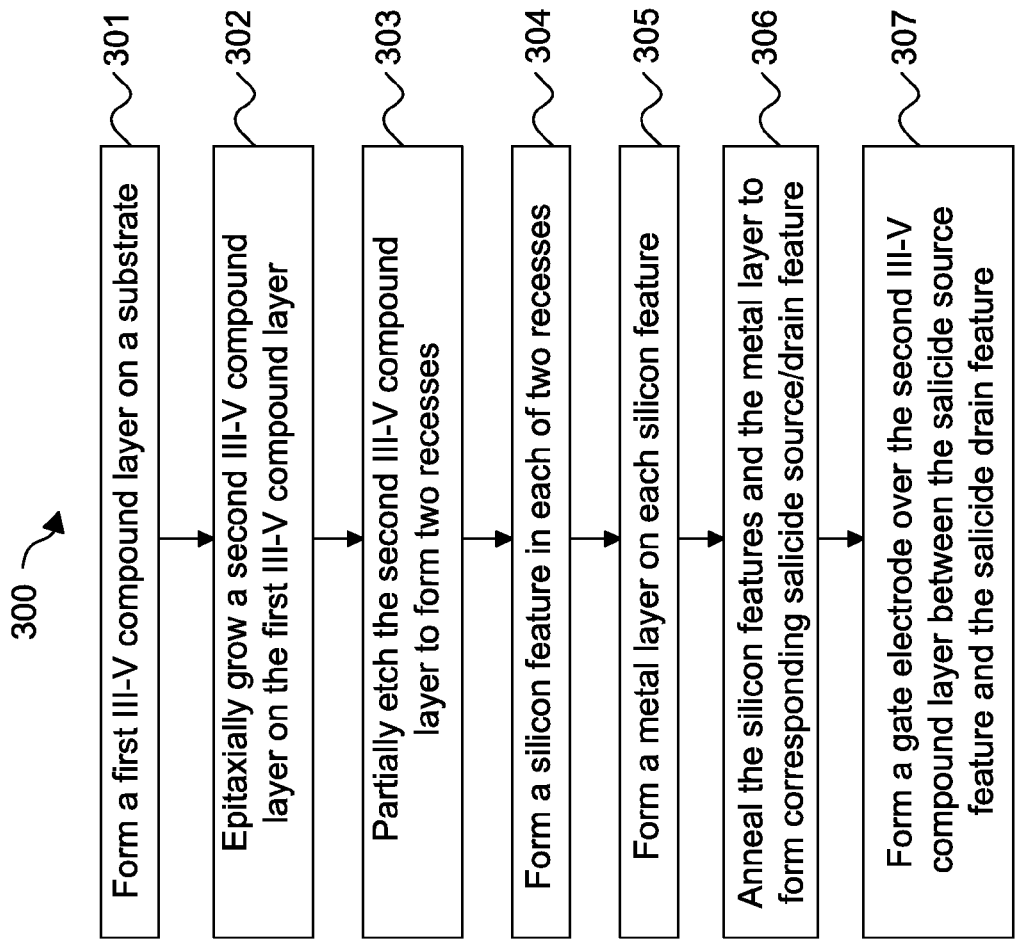
FIG. 3 is a flowchart of a method of forming a semiconductor structure having a HEMT according to one or more embodiments of this disclosure.

FIG. 3 is a flowchart of a method 300 of forming a semiconductor structure having a HEMT according to one or more embodiments of this disclosure. Referring now to FIG. 3, the flowchart of the method 300, at operation 301, a first III-V compound layer is provided. The first III-V compound layer is formed on a substrate. Next, the method 300 continues with operation 302 in which a second III-V compound layer is epitaxially grown on the first III-V compound layer. The method 300 continues with operation 303 in which the second III-V compound layer is partially etched to form two through holes in the second III-V compound layer. The method 300 continues with operation 304 in which a silicon feature is formed in each of two through holes. The method 300 continues with operation 305 in which a metal layer is form on each silicon feature. The metal layer includes at least one of Ti, Co, Ni, W, Pt, Ta, Pd and Mo. The method 300 continues with operation 306 in which the silicon features and the metal layer are annealed to form corresponding salicide source/drain features in each of two through holes. The method 300 continues with operation 307 in which a gate electrode is formed over the second III-V compound layer between the salicide source feature and the salicide drain feature. It should be noted that additional processes may be provided before, during, or after the method 300 of FIG. 3.

FIGS. 4 to 13B are cross-sectional views of the semiconductor structures 100A and 100B each having a HEMT at various stages of manufacture according to various embodiments of the method 300 of FIG. 3. Various figures have been simplified for a better understanding of the inventive concepts of the present disclosure.

Referring to FIG. 4, which is an enlarged cross-sectional view of a portion of a substrate 102 of a semiconductor structure 100A after performing operations 301 and 302 in method 300. In some embodiments, the substrate 102 includes a silicon carbide (SiC) substrate or sapphire substrate. In the present embodiment, the substrate 102 includes a silicon substrate. A first III-V compound layer 104, also referred to as a channel layer, is formed on the substrate 102. In the embodiment of FIGS. 4-13, the first III-V compound layer 104 refers to a gallium nitride (GaN) layer (also referred to as the GaN layer 104). In some embodiments, the GaN layer 104 is epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In the embodiment of FIGS. 4-13B, the GaN layer 104 has a thickness in a range from about 0.5 micron to about 10 microns. In other embodiments, the first III-V compound layer 104 may include a GaAs layer or InP layer.

A second III-V compound layer 106, also referred to as donor-supply layer, is grown on first III-V compound layer 104. An interface is defined between the first III-V compound layer 104 and the second III-V compound layer 106. A carrier channel 108 of 2-DEG is located at the interface of the first III-V compound layer 104 and the second III-V compound layer 106. In at least one embodiment, the second III-V compound layer 106 refers to an aluminum gallium nitride (AlGaN) layer (also referred to as the AlGaN layer 106). In the embodiment of FIGS. 4-13B, the AlGaN layer 106 is epitaxially grown on the GaN layer 104 by MOVPE using aluminum-containing precursor, gallium-containing precursor and nitrogen-containing precursor. The aluminum-containing precursor includes trimethylaluminum (TMA), triethylaluminium (TEA), or other suitable chemical. The gallium-containing precursor includes TMG, TEG or other suitable chemicals. The nitrogen-containing precursor includes ammonia ($NH_3$), tertiarybutylamine (TBAm), phenyl hydrazine, or other suitable chemical. In the embodiment of FIGS. 4-13B, the AlGaN layer 106 has a thickness in a range from about 5 nanometers to about 50 nanometers. In other embodiments, the second III-V compound layer 106 includes an AlGaAs layer, an AlN layer or an AlInP layer.

After performing operations 301 and 302, a dielectric cap layer 110 is deposited on a top surface 107 of the AlGaN layer 106. The dielectric cap layer 110 has a thickness in a range from about 100 angstroms (Å) to about 5000 Å. In some embodiments, the dielectric cap layer 110 includes $SiO_2$ or $Si_3N_4$. In at least one example, the dielectric cap layer 110 is $Si_3N_4$ and is formed by performing a low pressure chemical vapor deposition (LPCVD) method, without plasma, using $SiH_4$ and $NH_3$ gases. An operation temperature for performing the LPCVD is in a range of from about 650° C. to about 800° C. An operation pressure for performing the LPCVD is in a range of about 0.1 Ton and about 1 Ton. The dielectric cap layer 110 protects the underlying AlGaN layer 106 from damage in the following processes including plasma environments. Next, two openings 109A in the dielectric cap layer 110 are defined by lithography and etching processes to expose a portion of a top surface 107 of the AlGaN layer 106.

Referring back to FIG. 3, method 300 continues with operation 303. FIG. 5 illustrates a cross-sectional view of the semiconductor structure 100A for the manufacture stage after partially etching the AlGaN layer 106 to form two through holes 109B.

In FIG. 5, the exposed portions of the AlGaN layer 106 through the openings 109A are removed by a suitable process such as reactive ion etching (RIE) to form a through hole 109B within each opening 109A in the AlGaN layer 106. In at least one embodiment, the AlGaN layer 106 is etched with a plasma process, e.g., chlorine ($Cl_2$) environment. In at least another embodiment, the AlGaN layer 106 is removed with an argon (Ar) sputtering process. In at least one example, the through hole 109B extends to a depth D at least to a thickness of the AlGaN layer 106. In at least another example, the through hole 109B further extends into the GaN layer 104 and the depth D of the through hole 109B is substantially larger than a distance of the thin layer 108 (also referred to as 2-DEG) to the top surface 107 of the AlGaN layer 106. It is believed that the through hole etching process on the AlGaN layer 106 in the plasma environment creates nitrogen (N) vacancies in the AlGaN layer 106 and the GaN 104. The N vacancies increase carriers so that the electrical performances for the device are improved.

Figure 6:
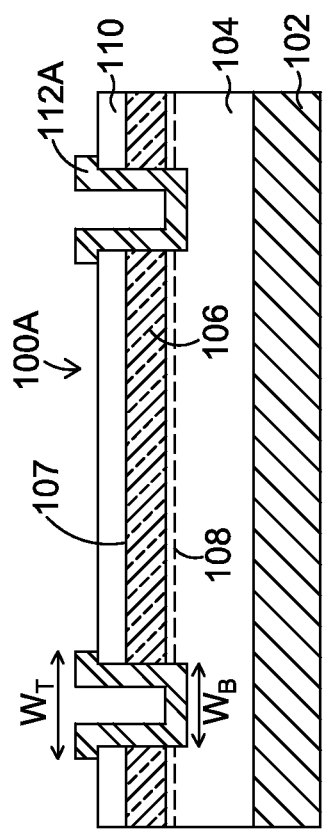

Referring back to FIG. 3, method 300 continues with operation 304. FIG. 6 illustrates a cross-sectional view of the semiconductor structure 100A for the manufacture stage after forming a silicon feature 112A in each of two through holes 109B.

In FIG. 6, a layer of silicon feature 112A deposited over the dielectric cap layer 110, disposed over the interior surface of the openings 109A and the through holes 109B, and contacts a bottom surface of the through holes 109B. A photoresist layer (not shown) is formed over the layer of silicon feature 112A and developed to form a feature over the openings 109. The layer of silicon feature 112A not covered by the feature of the photoresist layer is removed by a reactive ion etch (RIE) process. Silicon features 112A are generated after the etching process. The photoresist layer is removed after the formation of the silicon features 112A. The silicon feature 112A is at least partially embedded in the through hole 109B of the AlGaN layer 106 and the dielectric cap layer 110. In at least one embodiment, the silicon feature 112A includes polycrystalline silicon, amorphous silicon or single crystalline silicon. The layer of silicon feature 112A has a thickness substantially less than 30 nm.

In one embodiment, the silicon feature 112A is at least partially embedded in the AlGaN layer 106, a top portion of the GaN layer 104 and overlies a portion of the dielectric cap layer 110. Thereby, the silicon feature 112A has a concave top surface. The silicon feature 112A has a top width $W_T$ and a bottom width $W_B$. The top width $W_T$ is wider than the bottom width $W_B$.

In another embodiment, the silicon feature 112A is partially embedded in the AlGaN layer 106 and does not overlie a portion of the dielectric cap layer 110. The top width $W_T$ and the bottom width $W_B$ are substantially the same.

Figure 7:
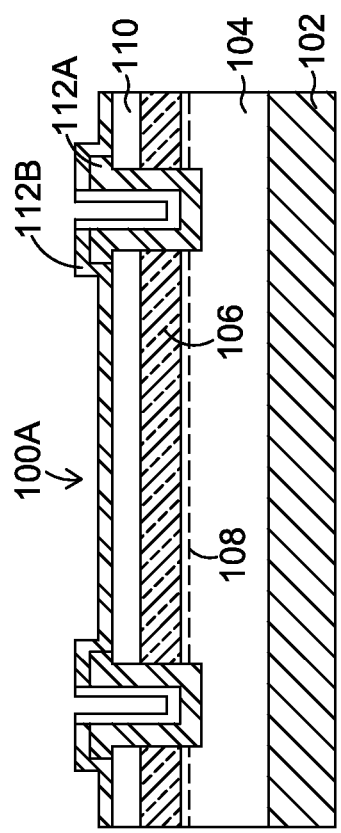

Referring back to FIG. 3, method 300 continues with operation 305. FIG. 7 illustrates a cross-sectional view of the semiconductor structure 100A for the manufacture stage after forming a metal layer 112B on the silicon features 112A.

In FIG. 7, the metal layer 112B is formed on the silicon features 112A and over the dielectric cap layer 110. The metal layer 112B may include one or more conductive materials. In at least one example, the metal layer 112B includes at least one of Ti, Co, Ni, W, Pt, Ta, Pd and Mo. The metal layer 112B has a thickness substantially less than 30 nm. The formation methods of the metal layer 112B include atomic layer deposition (ALD) or physical vapor deposition (PVD) processes. The metal layer 112B extends into openings of the silicon features 112A.

Figure 8:
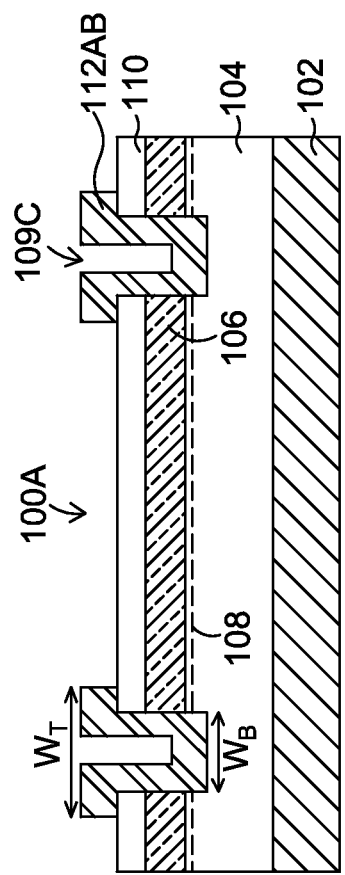

Referring back to FIG. 3, method 300 continues with operation 306. FIG. 8 illustrates a cross-sectional view of the semiconductor structure 100A for the manufacture stage after the metal layer 112B and the silicon features 112A are annealed.

In FIG. 8, a thermal annealing process may be applied to the metal layer 112B and the silicon features 112A such that the metal layer 112B, the silicon features 112A, the AlGaN layer 106 and the GaN layer 104 react to form corresponding salicide source/drain features 112AB. A wet chemical etching process rinses off the unreacted metal layer 112B, leaving only the salicide source/drain features 112AB. The salicide source/drain feature 112AB has an intermetallic compound for effective electrical connection to the carrier channel 108. In at least one embodiment, a rapid thermal annealing (RTA) apparatus and process are utilized for the thermal annealing. The thermal annealing is operated at an annealing temperature in a range between about 800° C. and about 1000° C. Due to the formation of the through hole 109B in the AlGaN layer 106, the silicon elements in the intermetallic compound may diffuse deeper into the AlGaN layer 106 and the GaN layer 104. The intermetallic compound may improve electrical connection and form ohmic contacts between the salicide source/drain features 112AB and the carrier channel 108. In one example, the salicide source/drain feature 112AB comprises silicon and a metal including at least one of Ti, Co, Ni, W, Pt, Ta, Pd and Mo. The salicide source/drain feature 112AB is free of Au.

Advantageously, the layer of silicon feature 112A has a thickness substantially less than 30 nm in operation 304. With this thickness, the silicon feature 112A could be completely consumed and converted into the salicide source/drain feature 112AB without residues. The ohmic contact could be achieved after operation 306.

In one embodiment, the salicide source/drain feature 112AB is at least partially embedded in the AlGaN layer 106, a top portion of the GaN layer 104 and overlies a portion of the dielectric cap layer 110. The salicide source/drain feature 112AB is disposed over the interior surface of the openings 109A and the through holes 109B. Thereby, the salicide source/drain feature 112AB has a concave top surface. The salicide source/drain feature 112AB has a top width $W_T$ and a bottom width $W_B$. The top width $W_T$ is wider than the bottom width $W_B$. The semiconductor structure 100A may include an opening 109C after the salicide source/drain features 112AB formation.

In another embodiment, the salicide source/drain feature 112AB is partially embedded in the AlGaN layer 106 and does not overlie a portion of the dielectric cap layer 110. The top width $W_T$ and the bottom width $W_B$ are substantially the same.

Figure 9:
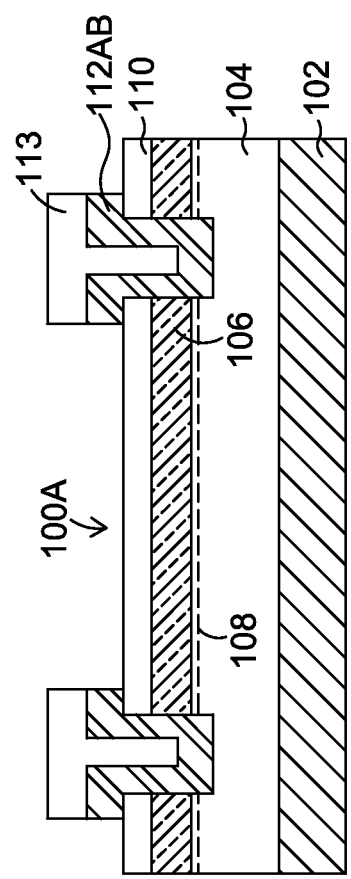

In FIG. 9, an ohmic metal layer is deposited on the salicide source/drain features 112AB, into openings 109C of the salicide source/drain features 112AB and over the dielectric cap layer 110 after performing operation 306. A photoresist layer (not shown) is formed over the ohmic metal layer and developed to form a feature. The ohmic metal layer not covered by the feature of the photoresist layer is removed by a reactive ion etch (RIE) process. Ohmic metal units 113 are generated after the etching process. The photoresist layer is removed after the formation of the ohmic metal units 113. In one example, the ohmic metal unit 113 is free of Au and comprises Al, Ti, Cu, Mo, Ti or Ni. In another example, ohmic metal unit 113 includes a bottom Ti/TiN layer, an AlCu layer overlying the bottom Ti/TiN layer and a top Ti layer overlying the AlCu layer. The bottom Ti/TiN layer has a thickness in a range from about 100 Å to about 1000 Å. The AlCu layer has a thickness in a range from about 100 Å to about 5000 Å. The top Ti layer has a thickness in a range from about 100 Å to about 1000 Å. The formation methods of the ohmic metal layer include atomic layer deposition (ALD) or physical vapor deposition (PVD) processes. Without using Au in the ohmic metal units 113, the method 300 is also implemented in the production line of integrated circuits on silicon substrate, because the contamination concern from the use of Au on the silicon fabrication process is eliminated.

Figure 10:
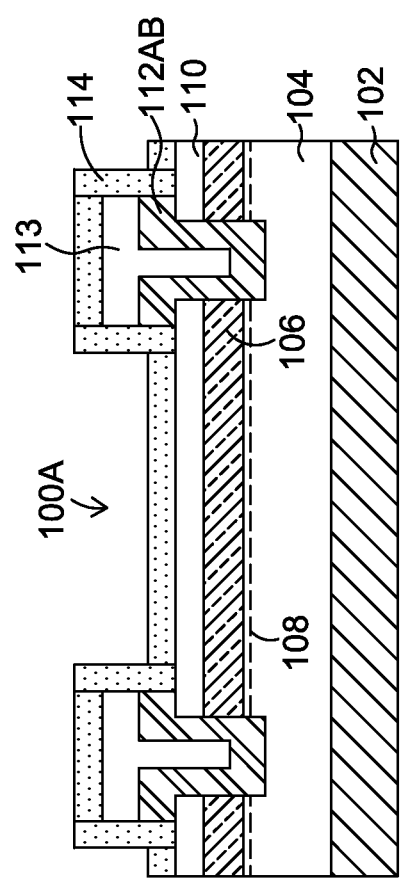
Figure 11:
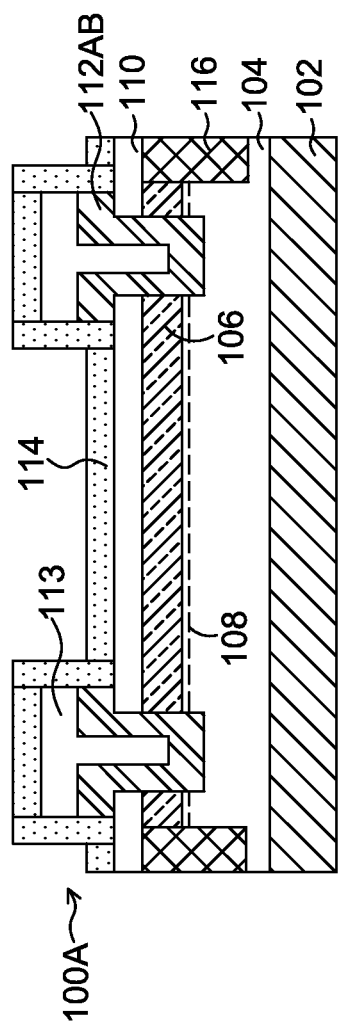

FIG. 10 is a cross-sectional view of the semiconductor structure 100A after depositing a protection layer 114 on each salicide source/drain feature 112AB, each ohmic metal unit 113 and the dielectric cap layer 110. In some embodiments, the protection layer 114 includes dielectric materials such as SiO$_2$ or Si3N$_4$. In at least one example, protection layer 114 is Si3N$_4$ and is formed by a plasma enhanced chemical vapor deposition (PECVD) method. The protection layer 116 has a thickness in a range from about 100 nanometers to about 700 nanometers FIG. 11 illustrates the semiconductor structure 100A after forming isolation regions 116 in the GaN layer 104 and the AlGaN layer 106. The isolation regions 116 isolate the HEMT in the semiconductor structure 100A from other devices in the substrate 102. In at least one example, the isolation region 116 is formed by an implantation process with species of oxygen or nitrogen. The protection layer 114 covers the salicide source/drain features 112AB and ohmic metal units 113, and prevents the salicide source/drain features 112AB and ohmic metal units 113 from exposure during an annealing process after the implantation process for the isolation region 116 formation.

Figure 12:
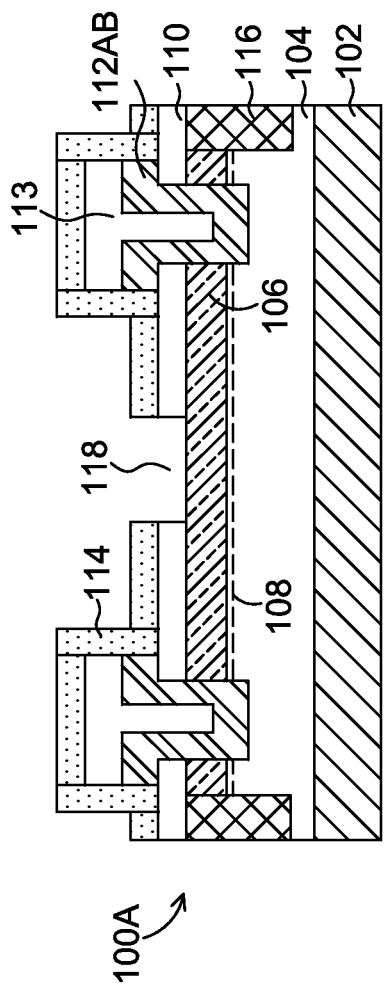

FIG. 12 illustrates the semiconductor structure 100A after forming a combined opening 118 in the protection layer 114 and the dielectric cap layer 110. A patterned mask layer (not shown) is formed on a top surface of the protection layer 114 and an etching process is performed to remove a portion of the protection layer 114 and the dielectric cap layer 110. The opening 118 exposes a portion of the top surface 107 of the AlGaN layer 106. The exposed portion of the AlGaN layer 106 has a substantially flat top surface between the salicide source/drain features 112AB. The opening 118 is configured as a location for the later gate electrode formation.

Figure 13A:
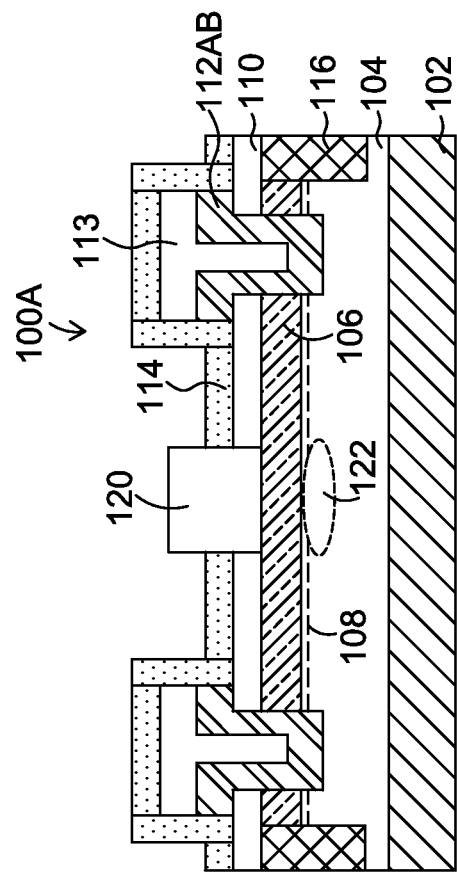

In FIG. 13A, the semiconductor structure 100A further includes a depletion region 122 in the carrier channel 108 under the combined opening of the protection layer 114 and the dielectric cap layer 110. The carrier channel 108 becomes normally-off because of the depletion region 122.

In one embodiment, a carrier depletion layer (not shown) is formed to deplete the electrons in depletion region 122 of the carrier channel 108 under the combined opening 118. The carrier depletion layer is disposed along an interior surface of the combined opening of the protection layer 114 and the dielectric cap layer 110, on the exposed portion of the AlGaN layer 106 and underlying a portion of the gate electrode 120. In some examples, the carrier depletion layer comprises NiO$_x$, ZnO$_x$, FeO$_x$, SnO$_x$, CuAlO$_2$, CuGaO$_2$ or SrCu$_2$O$_2$. X is in a range of about 1 to about 2. The carrier depletion layer contains point defects, for example, ZnO$_x$ has Zn interstitials and oxygen vacancies. In at least one example, the carrier depletion layer is NiO$_x$. A nickel layer is formed by a sputtering deposition with a nickel target. Then, an oxidation process is performed to convert the nickel layer into NiO$_x$. In other embodiments, the carrier depletion layer is formed by an atomic layer deposition (ALD) method or plasma enhanced chemical vapor deposition (PECVD) method.

In another embodiment, a fluorine-containing region is formed (not shown) in a portion of the AlGaN layer 106 to deplete the electrons in depletion region 122 of the carrier channel 108. In some examples, an implantation process including dopants F or BF$_2$ is performed to form the fluorine-containing region. An energy power of the implantation process is from about 5 Kev to about 20 Kev. A dosage of the dopants is in a range of about 1E12 ion/cm$^2$ to about 1E15 ion/cm$^2$.

Referring back to FIG. 3, method 300 continues with operation 307. FIG. 13A illustrates a cross-sectional view of the semiconductor structure 100A for the manufacture stage after a gate electrode 120 disposed in the combined opening 118 over AlGaN layer 106 between the salicide source/drain features 112AB.

In FIG. 13A, a gate electrode layer is deposited over the depletion region 122 and overfills the combined opening 118. Lithography and etching processes are performed on the gate electrode layer to define the gate electrode 120 between the salicide source/drain features 112AB. In various examples, the gate electrode layer includes a refractory metal or its compounds, e.g., titanium (Ti), titanium nitride (TiN), titanium tungsten (TiW), titanium tungsten nitride (TiWN), tungsten (W) or tungsten nitride (WN). By using the refractory metals or compounds, the method 300 can be implemented in the production line of integrated circuits on silicon substrate. The contamination concern due to unsuitable materials on the silicon-fabrication process is eliminated. In at least another example, the gate electrode layer includes nickel (Ni), gold (Au) or copper (Cu).

Figure 13B:
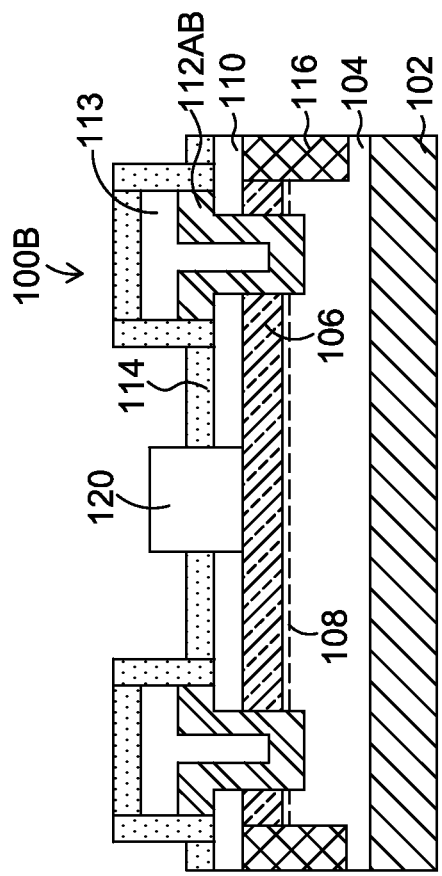

FIG. 13B is a cross-sectional view of the semiconductor structure 100B having another HEMT according to various embodiments of the method 300 of FIG. 3. The layer stacks and manufacture methods of the semiconductor structure 100B are similar to the semiconductor structure 100A. However, the HEMT in the semiconductor structure 100B is a depletion-mode HEMT (also referred to as depletion-mode HEMT 100B). The depletion-mode HEMT 100B has a normally-on carrier channel and a negative gate voltage is applied to turn off the carrier channel. The depletion-mode HEMT 100B does not include the depletion region 122, the carrier depletion layer or the fluorine-containing region of the enhanced-mode HEMT 100A.

Various embodiments of the present disclosure are used to improve the performance of a semiconductor structure having a high electron mobility transistor (HEMT). For example, in conventional methods, a portion of the AlGaN layer 106 is partially etched to form a recess for the source/drain formation of a HEMT. A remained portion of AlGaN layer 106 is under the recess. Due to keeping the remained portion of AlGaN layer 106, the etching uniformity among the semiconductor chip regions on the same substrate 102 is hard to control. The electrical performances of each HEMT in the same semiconductor chip region or the same substrate 102 is not accurately controlled. In this disclosure, a through hole 109B extends to a depth D at least to a thickness of the AlGaN layer 106. The etching process of the through hole 109B among the semiconductor chip regions on the same substrate 102 is uniformly formed. The through hole 109B eliminates the drawbacks in conventional methods. The salicide source/drain feature 112AB formed in the through hole 109B may improve electrical connection and form an ohmic contact to the carrier channel 108. The salicide source/drain feature 112AB is free of Au. Without using Au in the salicide source/drain feature 112AB, the method 300 is implemented in the production line of integrated circuits on silicon substrate, because the contamination concern from Au on the silicon-Fab process is eliminated. Compared with the HEMT having Au in source/drain, the cost for manufacturing the HEMT according to the present application is reduced. Both the III-V semiconductor compounds process and the silicon-fabrication process are implemented in the same production line, which increases the flexibility to allocate different products for the production line.

One aspect of this disclosure describes a high electron mobility transistor (HEMT). The HEMT includes a first III-V compound layer. A second III-V compound layer is disposed on the first III-V compound layer and is different from the first III-V compound layer in composition. A carrier channel is located between the first III-V compound layer and the second III-V compound layer. A salicide source feature and a salicide drain feature are in contact with the first III-V compound layer through the second III-V compound layer. A gate electrode is disposed over a portion of the second III-V compound layer between the salicide source feature and the salicide drain feature.

Another aspect of this disclosure describes a high electron mobility transistor (HEMT). The HEMT includes a gallium nitride (GaN) layer disposed on a substrate. An aluminum gallium nitride (AlGaN) layer disposed on the GaN layer. A salicide source feature and a salicide drain feature are spaced apart and disposed on the AlGaN layer. Each of the salicide source feature and the salicide drain feature has a concave top surface. A gate electrode is disposed over a portion of the AlGaN layer between the salicide source feature and the salicide drain feature.

The present disclosure also describes an aspect of a method of forming a high electron mobility transistor (HEMT). The method includes epitaxially growing a second III-V compound layer on a first III-V compound layer. A carrier channel is located between the first III-V compound layer and the second III-V compound layer. The second III-V compound layer is partially etched to form two through holes in the second III-V compound layer. A silicon feature is formed in each of two through holes. A metal layer is deposited on each silicon feature. The metal layer and each silicon feature are annealed to form corresponding salicide source/drain features. A gate electrode is formed over the second III-V compound layer between the salicide source feature and the salicide drain feature.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A high electron mobility transistor (HEMT) comprising:
a first III-V compound layer;
a second III-V compound layer on the first III-V compound layer and different from the first III-V compound layer in composition, wherein a carrier channel is located in the first III-V compound layer along an interface between the first III-V compound layer and the second first III-V compound layer;
a cap layer over the second III-V layer;
a salicide source feature and a salicide drain feature in contact with the first III-V compound layer through the second III-V compound layer, wherein at least one of the silicide source feature or the silicide drain feature extends along a top portion of the cap layer; and
a gate electrode over a portion of the second III-V compound layer between the salicide source feature and the salicide drain feature.

2. The HEMT of claim 1, wherein each of the salicide source feature and the salicide drain feature comprises silicon and a metal including at least one of Ti, Co, Ni, W, Pt, Ta, Pd or Mo.

3. The HEMT of claim 1, wherein each of the salicide source feature and the salicide drain feature contacts the carrier channel.

4. The HEMT of claim 1 further comprising an ohmic metal unit on each of the salicide source feature and the salicide drain feature.

5. The HEMT of claim 4, wherein the ohmic metal unit comprises Al, Ti, Cu, Mo, Ti or Ni.

6. The HEMT of claim 4, wherein the ohmic metal unit is at least partially embedded in each of the salicide source feature and the salicide drain feature.

7. The HEMT of claim 1, wherein each of the salicide source feature and the salicide drain feature is at least partially embedded in the second III-V compound layer and a portion of the first III-V compound layer.

8. The HEMT of claim 1, wherein each of the salicide source feature and the salicide drain feature has a concave top surface.

9. The HEMT of claim 1, wherein the gate electrode comprises titanium (Ti), titanium nitride (TiN), titanium tungsten (TiW), titanium tungsten nitride (TiWN), tungsten (W) or tungsten nitride (WN).

10. The HEMT of claim 1 further comprising a region configured to deplete a portion of the carrier channel, wherein the region is under the gate electrode and above the first III-V compound layer.

11. The HEMT of claim 1, wherein the at least one of the silicide source feature or the silicide drain feature is in direct contact with the cap layer.

12. A high electron mobility transistor (HEMT) comprising:
a gallium nitride (GaN) layer on a substrate;
an aluminum gallium nitride (AlGaN) layer on the GaN layer;
a salicide source feature and a salicide drain feature spaced apart and at least partially embedded in the AlGaN layer, wherein each of the salicide source feature and the salicide drain feature has a concave top surface;
a gate electrode over a portion of the AlGaN layer between the salicide source feature and the salicide drain feature; and
an ohmic unit on each of the silicide source feature and the silicide drain feature; and
a protection layer extending along sidewalls and a top surface of the ohmic unit.

13. The HEMT of claim 12, wherein a carrier channel is located between the GaN layer and the AlGaN layer, the carrier channel comprising a depletion region under the gate electrode.

14. The HEMT of claim 12, wherein each of the salicide source feature and the salicide drain feature has a top width larger than a bottom width.

15. The HEMT of claim 12, wherein each of the salicide source feature and the salicide drain feature comprises silicon and a metal including at least one of Ti, Co, Ni, W, Pt, Ta, Pd or Mo.

16. The HEMT of claim 12, wherein each of the salicide source feature and the salicide drain feature contacts a carrier channel located between the GaN layer and the AlGaN layer.

17. The HEMT of claim 12, wherein the ohmic unit is free of Au and comprises Al, Ti, Cu, Mo, Ti or N.

18. The HEMT of claim 16, wherein the ohmic unit is at least partially embedded in each of the salicide source feature and the salicide drain feature.

19. The HEMT of claim 16, wherein a bottom surface of the ohmic unit is lower than a top surface of the AlGaN layer.

20. A high electron mobility transistor (HEMT) comprising:
- a channel layer;
- a donor-supply layer on the channel layer and different from the channel layer in composition;
- a salicide source feature and a salicide drain feature in contact with the channel layer through the donor-supply layer;
- a gate electrode over a portion of the donor-supply layer between the salicide source feature and the salicide drain feature; and
- a carrier depletion layer between the gate electrode and the donor-supply layer, wherein the carrier depletion layer contains point defects.

* * * * *